(12) United States Patent
Sim et al.

(10) Patent No.: US 9,620,048 B2
(45) Date of Patent: Apr. 11, 2017

(54) METHODS FOR DRIVING ELECTRO-OPTIC DISPLAYS

(71) Applicant: E INK CORPORATION, Billerica, MA (US)

(72) Inventors: Teck Ping Sim, Waltham, MA (US); Kenneth R. Crounse, Somerville, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 14/445,641

(22) Filed: Jul. 29, 2014

(65) Prior Publication Data

US 2014/0333685 A1 Nov. 13, 2014
US 2016/0240124 A9 Aug. 18, 2016

Related U.S. Application Data

(60) Provisional application No. 61/859,967, filed on Jul. 30, 2013.

(51) Int. Cl.
*G09G 3/00* (2006.01)
*G09G 3/20* (2006.01)
(Continued)

(52) U.S. Cl.
CPC ......... *G09G 3/2003* (2013.01); *G02B 3/0056* (2013.01); *G09G 3/2011* (2013.01); *G09G 3/344* (2013.01); *G09G 3/348* (2013.01); *G09G 3/3433* (2013.01); *G09G 3/38* (2013.01); *H01L 31/0543* (2014.12); *H01L 31/0547* (2014.12); *H02S 20/32* (2014.12); *H02S 40/22* (2014.12); *G09G 2310/0262* (2013.01);
(Continued)

(58) Field of Classification Search
CPC ......... G02B 3/0056; G09G 2310/0262; G09G 2310/065; G09G 3/2003; G09G 3/344; G09G 3/348; G09G 3/38; H01L 31/0543; H01L 31/0547; H02S 20/32; H02S 40/22; Y02B 10/12; Y02E 10/52
USPC ...................... 345/87, 60, 105–107, 690–691
See application file for complete search history.

(56) References Cited

U.S. PATENT DOCUMENTS 4,418,346 A   11/1983   Batchelder
5,541,747 A * 7/1996   Nishi ................... G09G 3/3651
                                                       349/49
(Continued)

OTHER PUBLICATIONS

Kitamura, T., et al., "Electrical toner movement for electronic paper-like display", Asia Display/IDW '01, p. 1517, Paper HCS1-1 (2001) Dec. 31, 2001.
(Continued)

*Primary Examiner* — Tony Davis
(74) *Attorney, Agent, or Firm* — Brian D. Bean

(57) ABSTRACT

An electro-optic display has a plurality of pixels, each of which is capable of displaying two extreme optical states and at least one intermediate gray level. Each pixel is driven from an initial intermediate gray level to one extreme optical state and then to a first desired intermediate gray level, so producing a first image on the display. The pixel then remains at this first desired intermediate gray level for a finite length of time. The pixel is then driven from this first desired intermediate gray level to the opposed extreme optical state and then to a second desired intermediate gray level, so producing a second image on the display.

13 Claims, 1 Drawing Sheet

(51) Int. Cl.
  *G09G 3/34* (2006.01)
  *H01L 31/054* (2014.01)
  *H02S 20/32* (2014.01)
  *H02S 40/22* (2014.01)
  *G02B 3/00* (2006.01)
  *G09G 3/38* (2006.01)

(52) U.S. Cl.
  CPC . *G09G 2310/065* (2013.01); *G09G 2310/067* (2013.01); *G09G 2320/041* (2013.01); *Y02B 10/12* (2013.01); *Y02E 10/52* (2013.01)

(56) References Cited

U.S. PATENT DOCUMENTS

| | | |
|---|---|---|
| 5,760,761 A | 6/1998 | Sheridon |
| 5,777,782 A | 7/1998 | Sheridon |
| 5,808,783 A | 9/1998 | Crowley |
| 5,872,552 A | 2/1999 | Gordon, II |
| 5,930,026 A | 7/1999 | Jacobson |
| 5,933,203 A * | 8/1999 | Wu ................ G09G 3/3629 345/209 |
| 6,054,071 A | 4/2000 | Mikkelsen, Jr. |
| 6,055,091 A | 4/2000 | Sheridon |
| 6,097,531 A | 8/2000 | Sheridon |
| 6,128,124 A | 10/2000 | Silverman |
| 6,130,774 A | 10/2000 | Albert |
| 6,137,467 A | 10/2000 | Sheridon |
| 6,144,361 A | 11/2000 | Gordon, II |
| 6,147,791 A | 11/2000 | Sheridon |
| 6,172,798 B1 | 1/2001 | Albert |
| 6,184,856 B1 | 2/2001 | Gordon, II |
| 6,225,971 B1 | 5/2001 | Gordon, II |
| 6,241,921 B1 | 6/2001 | Jacobson |
| 6,271,823 B1 | 8/2001 | Gordon, II |
| 6,301,038 B1 | 10/2001 | Fitzmaurice |
| 6,407,727 B1 * | 6/2002 | Plangger ................ G09G 3/296 345/60 |
| 6,445,489 B1 | 9/2002 | Jacobson |
| 6,504,524 B1 | 1/2003 | Gates |
| 6,512,354 B2 | 1/2003 | Jacobson |
| 6,531,997 B1 | 3/2003 | Gates |
| 6,672,921 B1 | 1/2004 | Liang |
| 6,753,999 B2 | 6/2004 | Zehner |
| 6,788,449 B2 | 9/2004 | Liang |
| 6,825,970 B2 | 11/2004 | Goenaga |
| 6,866,760 B2 | 3/2005 | Paolini, Jr. |
| 6,870,657 B1 | 3/2005 | Fitzmaurice |
| 6,900,851 B2 | 5/2005 | Morrison |
| 6,922,276 B2 | 7/2005 | Zhang |
| 6,950,220 B2 | 9/2005 | Abramson |
| 6,982,178 B2 | 1/2006 | LeCain |
| 6,995,550 B2 | 2/2006 | Jacobson |
| 7,002,728 B2 | 2/2006 | Pullen |
| 7,012,600 B2 | 3/2006 | Zehner |
| 7,023,420 B2 | 4/2006 | Comiskey |
| 7,027,018 B2 * | 4/2006 | Nitta ................ G09G 3/3648 345/213 |
| 7,034,783 B2 | 4/2006 | Gates |
| 7,075,502 B1 | 7/2006 | Drzaic |
| 7,116,318 B2 | 10/2006 | Amundson |
| 7,116,466 B2 | 10/2006 | Whitesides |
| 7,119,772 B2 | 10/2006 | Amundson |
| 7,170,670 B2 | 1/2007 | Webber |
| 7,193,625 B2 | 3/2007 | Danner |
| 7,202,847 B2 | 4/2007 | Gates |
| 7,236,291 B2 | 6/2007 | Kaga |
| 7,259,744 B2 | 8/2007 | Arango |
| 7,304,787 B2 | 12/2007 | Whitesides |
| 7,312,784 B2 | 12/2007 | Baucom |
| 7,312,794 B2 | 12/2007 | Zehner |
| 7,321,459 B2 | 1/2008 | Masuda |
| 7,327,511 B2 | 2/2008 | Whitesides |
| 7,339,715 B2 | 3/2008 | Webber |
| 7,411,719 B2 | 8/2008 | Paolini, Jr. |
| 7,420,549 B2 | 9/2008 | Jacobson |
| 7,453,445 B2 | 11/2008 | Amundson |
| 7,492,339 B2 | 2/2009 | Amundson |
| 7,528,822 B2 | 5/2009 | Amundson |
| 7,535,624 B2 | 5/2009 | Amundson |
| 7,545,358 B2 | 6/2009 | Gates |
| 7,583,251 B2 | 9/2009 | Arango |
| 7,602,374 B2 | 10/2009 | Zehner |
| 7,612,760 B2 | 11/2009 | Kawai |
| 7,679,599 B2 | 3/2010 | Kawai |
| 7,679,814 B2 | 3/2010 | Paolini, Jr. |
| 7,688,297 B2 | 3/2010 | Zehner |
| 7,729,039 B2 | 6/2010 | LeCain |
| 7,733,311 B2 | 6/2010 | Amundson |
| 7,733,335 B2 | 6/2010 | Zehner |
| 7,787,169 B2 | 8/2010 | Abramson |
| 7,839,564 B2 | 11/2010 | Whitesides |
| 7,952,557 B2 | 5/2011 | Amundson |
| 7,956,841 B2 | 6/2011 | Albert |
| 7,999,787 B2 | 8/2011 | Amundson |
| 8,009,348 B2 | 8/2011 | Zehner |
| 8,077,141 B2 | 12/2011 | Duthaler |
| 8,125,501 B2 | 2/2012 | Amundson |
| 8,139,050 B2 | 3/2012 | Jacobson |
| 8,174,490 B2 | 5/2012 | Whitesides |
| 8,289,250 B2 | 10/2012 | Zehner |
| 8,300,006 B2 | 10/2012 | Zhou |
| 8,305,341 B2 | 11/2012 | Arango |
| 8,314,784 B2 | 11/2012 | Ohkami |
| 8,319,759 B2 | 11/2012 | Jacobson |
| 8,384,658 B2 | 2/2013 | Albert |
| 8,531,389 B2 | 9/2013 | Johnson |
| 8,558,783 B2 | 10/2013 | Wilcox et al. |
| 8,558,785 B2 | 10/2013 | Zehner |
| 8,593,396 B2 | 11/2013 | Amundson |
| 8,743,040 B2 * | 6/2014 | Ooishi ................ G09G 3/3648 345/89 |
| 8,928,562 B2 * | 1/2015 | Gates ................ G09G 3/344 345/60 |
| 2003/0102858 A1 | 6/2003 | Jacobson |
| 2003/0137521 A1 * | 7/2003 | Zehner ................ G02F 1/167 345/589 |
| 2004/0246562 A1 * | 12/2004 | Chung ................ G09G 3/344 359/296 |
| 2005/0001812 A1 * | 1/2005 | Amundson ............ G02F 1/167 345/107 |
| 2005/0253777 A1 | 11/2005 | Zehner |
| 2006/0290650 A1 * | 12/2006 | Johnson et al. ............ 345/107 |
| 2007/0091418 A1 | 4/2007 | Danner |
| 2007/0103427 A1 | 5/2007 | Zhou |
| 2008/0024429 A1 | 1/2008 | Zehner |
| 2008/0024482 A1 | 1/2008 | Gates |
| 2008/0136774 A1 | 6/2008 | Harris |
| 2008/0291129 A1 * | 11/2008 | Harris ................ G09G 3/2011 345/60 |
| 2008/0291184 A1 * | 11/2008 | Zhou et al. ................ 345/205 |
| 2008/0309612 A1 | 12/2008 | Gormish |
| 2009/0174651 A1 | 7/2009 | Jacobson |
| 2009/0179923 A1 | 7/2009 | Amundson |
| 2009/0195568 A1 * | 8/2009 | Sjodin ................ G09G 3/2011 345/690 |
| 2009/0231266 A1 * | 9/2009 | Lee et al. ................ 345/107 |
| 2009/0295710 A1 * | 12/2009 | Shimodaira ................ 345/107 |
| 2009/0322721 A1 | 12/2009 | Zehner |
| 2010/0073282 A1 * | 3/2010 | Murayama ................ 345/107 |
| 2010/0220121 A1 | 9/2010 | Zehner |
| 2010/0265561 A1 | 10/2010 | Gates et al. |
| 2011/0096053 A1 * | 4/2011 | Yamazaki ................ 345/211 |
| 2011/0187684 A1 * | 8/2011 | Amundson et al. ................ 345/204 |
| 2011/0285754 A1 | 11/2011 | Harrington |
| 2013/0194250 A1 * | 8/2013 | Amundson ............ G09G 3/344 345/212 |

(56) References Cited

U.S. PATENT DOCUMENTS

2013/0300779 A1* 11/2013 Van Baarsen et al. ....... 345/690

OTHER PUBLICATIONS

Yamaguchi, Y., et al., "Toner display using insulative particles charged triboelectrically", Asia Display/IDW '01, p. 1729, Paper AMD4-4 (2001) Dec. 31, 2001.
Hayes, R.A., et al., "Video-Speed Electronic Paper Based on Electrowetting", Nature, vol. 425, Sep. 25, pp. 383-385 (2003) Sep. 25, 2003.
International Search Report and Written Opinion for PCT/US2014/048812 Nov. 24, 2014.

* cited by examiner

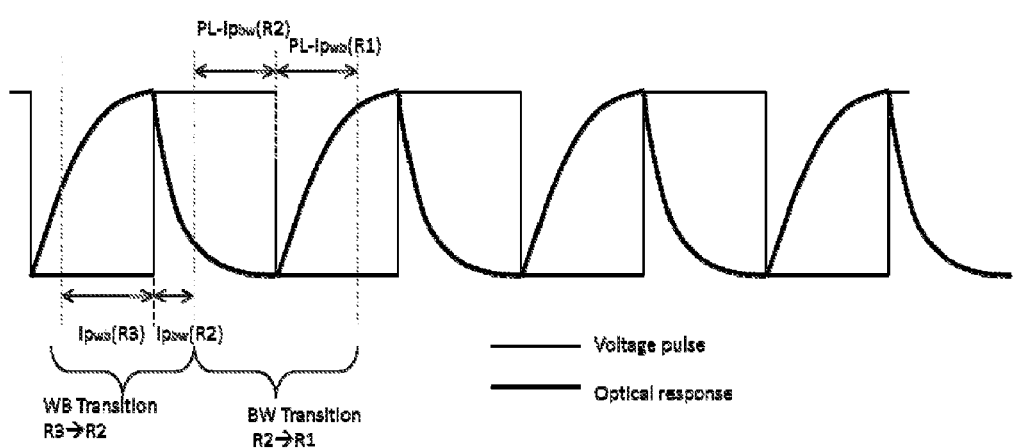

METHODS FOR DRIVING ELECTRO-OPTIC DISPLAYS

REFERENCE TO RELATED APPLICATIONS

This application is related to U.S. Pat. Nos. 5,930,026; 6,445,489; 6,504,524; 6,512,354; 6,531,997; 6,753,999; 6,825,970; 6,900,851; 6,995,550; 7,012,600; 7,023,420; 7,034,783; 7,116,466; 7,119,772; 7,193,625; 7,202,847; 7,259,744; 7,304,787; 7,312,794; 7,327,511; 7,453,445; 7,492,339; 7,528,822; 7,545,358; 7,583,251; 7,602,374; 7,612,760; 7,679,599; 7,688,297; 7,729,039; 7,733,311; 7,733,335; 7,787,169; 7,952,557; 7,956,841; 7,999,787; and 8,077,141; and U.S. Patent Applications Publication Nos. 2003/0102858; 2005/0122284; 2005/0179642; 2005/0253777; 2006/0139308; 2007/0013683; 2007/0091418; 2007/0103427; 2007/0200874; 2008/0024429; 2008/0024482; 2008/0048969; 2008/0129667; 2008/0136774; 2008/0150888; 2008/0291129; 2009/0174651; 2009/0179923; 2009/0195568; 2009/0256799; 2009/0322721; 2010/0045592; 2010/0220121; 2010/0220122; 2010/0265561 and 2011/0285754. This application is also related to copending application Ser. No. 13/755,111, filed Jan. 31, 2013, which claims benefit of provisional Application Ser. No. 61/593,361, filed Feb. 1, 2012.

The aforementioned patents and applications may hereinafter for convenience collectively be referred to as the "MEDEOD" (MEthods for Driving Electro-Optic Displays) applications. The entire contents of these patents and copending applications, and of all other U.S. patents and published and copending applications mentioned below, are herein incorporated by reference.

BACKGROUND OF INVENTION

The present invention relates to methods for driving electro-optic displays, especially bistable electro-optic displays, and to apparatus for use in such methods. More specifically, this invention relates to driving methods which may allow for reduced "ghosting" and edge effects, and reduced flashing in such displays. This invention is especially, but not exclusively, intended for use with particle-based electrophoretic displays in which one or more types of electrically charged particles are present in a fluid and are moved through the fluid under the influence of an electric field to change the appearance of the display.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example the aforementioned white and dark blue states. The term "monochrome" may be used hereinafter to denote a drive scheme which only drives pixels to their two extreme optical states with no intervening gray states.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "impulse" is used herein in its conventional meaning of the integral of voltage with respect to time. However, some bistable electro-optic media act as charge transducers, and with such media an alternative definition of impulse, namely the integral of current over time (which is equal to the total charge applied) may be used. The appropriate definition of impulse should be used, depending on whether the medium acts as a voltage-time impulse transducer or a charge impulse transducer.

Much of the discussion below will focus on methods for driving one or more pixels of an electro-optic display through a transition from an initial gray level to a final gray level (which may or may not be different from the initial gray level). The term "waveform" will be used to denote the entire voltage against time curve used to effect the transition from one specific initial gray level to a specific final gray level. Typically such a waveform will comprise a plurality of waveform elements; where these elements are essentially rectangular (i.e., where a given element comprises application of a constant voltage for a period of time); the elements may be called "pulses" or "drive pulses". The term "drive scheme" denotes a set of waveforms sufficient to effect all possible transitions between gray levels for a specific display. A display may make use of more than one drive scheme; for example, the aforementioned U.S. Pat. No. 7,012,600 teaches that a drive scheme may need to be modified depending upon parameters such as the temperature of the display or the time for which it has been in operation during its lifetime, and thus a display may be provided with a plurality of different drive schemes to be used at differing temperature etc. A set of drive schemes used in this manner may be referred to as "a set of related drive schemes." It is also possible, as described in several of the aforementioned MEDEOD applications, to use more than one drive scheme simultaneously in different areas of the same display, and a set of drive schemes used in this manner may be referred to as "a set of simultaneous drive schemes."

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in the these patents and applications include:

(a) Electrophoretic particles, fluids and fluid additives; see for example U.S. Pat. Nos. 7,002,728; and 7,679,814;
(b) Capsules, binders and encapsulation processes; see for example U.S. Pat. Nos. 6,922,276; and 7,411,719;
(c) Films and sub-assemblies containing electro-optic materials; see for example U.S. Pat. Nos. 6,982,178; and 7,839,564;
(d) Backplanes, adhesive layers and other auxiliary layers and methods used in displays; see for example U.S. Pat. Nos. 7,116,318; and 7,535,624;
(e) Color formation and color adjustment; see for example U.S. Pat. No. 7,075,502; and U.S. Patent Application Publication No. 2007/0109219;
(f) Methods for driving displays; see the aforementioned MEDEOD applications;
(g) Applications of displays; see for example U.S. Pat. No. 7,312,784; and U.S. Patent Application Publication No. 2006/0279527; and
(h) Non-electrophoretic displays, as described in U.S. Pat. Nos. 6,241,921; 6,950,220; and 7,420,549; and U.S. Patent Application Publication No. 2009/0046082.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic media may also be used in the displays of the present invention.

The bistable or multi-stable behavior of particle-based electrophoretic displays, and other electro-optic displays displaying similar behavior (such displays may hereinafter for convenience be referred to as "impulse driven displays"), is in marked contrast to that of conventional liquid crystal ("LC") displays. Twisted nematic liquid crystals are not bi- or multi-stable but act as voltage transducers, so that applying a given electric field to a pixel of such a display produces a specific gray level at the pixel, regardless of the gray level previously present at the pixel. Furthermore, LC displays are only driven in one direction (from non-transmissive or "dark" to transmissive or "light"), the reverse transition from a lighter state to a darker one being effected by reducing or eliminating the electric field. Finally, the gray level of a pixel of an LC display is not sensitive to the polarity of the electric field, only to its magnitude, and indeed for technical reasons commercial LC displays usually reverse the polarity of the driving field at frequent intervals. In contrast, bistable electro-optic displays act, to a first approximation, as impulse transducers, so that the final state of a pixel depends not only upon the electric field applied and the time for which this field is applied, but also upon the state of the pixel prior to the application of the electric field.

Whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed so that the next line of the display is written. This process is repeated so that the entire display is written in a row-by-row manner.

It might at first appear that the ideal method for addressing such an impulse-driven electro-optic display would be so-called "general grayscale image flow" in which a controller arranges each writing of an image so that each pixel transitions directly from its initial gray level to its final gray level. However, inevitably there is some error in writing images on an impulse-driven display. Some such errors encountered in practice include:

(a) Prior State Dependence; With at least some electro-optic media, the impulse required to switch a pixel to a new optical state depends not only on the current and desired optical state, but also on the previous optical states of the pixel.

(b) Dwell Time Dependence; With at least some electro-optic media, the impulse required to switch a pixel to a new optical state depends on the time that the pixel has spent in its various optical states. The precise nature of this dependence is not well understood, but in general, more impulse is required the longer the pixel has been in its current optical state.

(c) Temperature Dependence; The impulse required to switch a pixel to a new optical state depends heavily on temperature.

(d) Humidity Dependence; The impulse required to switch a pixel to a new optical state depends, with at least some types of electro-optic media, on the ambient humidity.

(e) Mechanical Uniformity; The impulse required to switch a pixel to a new optical state may be affected by mechanical variations in the display, for example variations in the thickness of an electro-optic medium or an associated lamination adhesive. Other types of mechanical non-uniformity may arise from inevitable variations between different manufacturing batches of medium, manufacturing tolerances and materials variations.

(f) Voltage Errors; The actual impulse applied to a pixel will inevitably differ slightly from that theoretically applied because of unavoidable slight errors in the voltages delivered by drivers.

General grayscale image flow suffers from an "accumulation of errors" phenomenon. For example, imagine that temperature dependence results in a 0.2 L* (where L* has the usual CIE definition:

$$L^*=116(R/R_0)^{1/3}-16,$$

where R is the reflectance and $R_0$ is a standard reflectance value) error in the positive direction on each transition. After fifty transitions, this error will accumulate to 10 L*. Perhaps more realistically, suppose that the average error on each transition, expressed in terms of the difference between the theoretical and the actual reflectance of the display is ±0.2 L*. After 100 successive transitions, the pixels will display an average deviation from their expected state of 2 L*; such deviations are apparent to the average observer on certain types of images.

This accumulation of errors phenomenon applies not only to errors due to temperature, but also to errors of all the types listed above. As described in the aforementioned U.S. Pat. No. 7,012,600, compensating for such errors is possible, but only to a limited degree of precision. For example, temperature errors can be compensated by using a temperature sensor and a lookup table, but the temperature sensor has a limited resolution and may read a temperature slightly different from that of the electro-optic medium. Similarly, prior state dependence can be compensated by storing the prior states and using a multi-dimensional transition matrix, but controller memory limits the number of states that can be recorded and the size of the transition matrix that can be stored, placing a limit on the precision of this type of compensation.

Thus, general grayscale image flow requires very precise control of applied impulse to give good results, and empirically it has been found that, in the present state of the technology of electro-optic displays, general grayscale image flow is infeasible in a commercial display.

Under some circumstances, it may be desirable for a single display to make use of multiple drive schemes. For example, a display capable of more than two gray levels may make use of a gray scale drive scheme ("GSDS") which can effect transitions between all possible gray levels, and a monochrome drive scheme ("MDS") which effects transitions only between two gray levels, the MDS providing quicker rewriting of the display that the GSDS. The MDS is used when all the pixels which are being changed during a rewriting of the display are effecting transitions only between the two gray levels used by the MDS. For example, the aforementioned U.S. Pat. No. 7,119,772 describes a display in the form of an electronic book or similar device capable of displaying gray scale images and also capable of displaying a monochrome dialogue box which permits a user to enter text relating to the displayed images. When the user is entering text, a rapid MDS is used for quick updating of the dialogue box, thus providing the user with rapid confirmation of the text being entered. On the other hand, when the entire gray scale image shown on the display is being changed, a slower GSDS is used.

Alternatively, a display may make use of a GSDS simultaneously with a "direct update" drive scheme ("DUDS"). The DUDS may have two or more than two gray levels, typically fewer than the GSDS, but the most important characteristic of a DUDS is that transitions are handled by a simple unidirectional drive from the initial gray level to the final gray level, as opposed to the "indirect" transitions often used in a GSDS, where in at least some transitions the pixel is driven from an initial gray level to one extreme optical state, then in the reverse direction to a final gray level (this type of waveform may for convenience be referred to as a "single rail bounce" waveform); in some cases, the transition may be effected by driving from the initial gray level to one extreme optical state, thence to the opposed extreme optical state, and only then to the final extreme optical state (this type of waveform may for convenience be referred to as a "double rail bounce" waveform)—see, for example, the drive scheme illustrated in FIGS. 11A and 11B of the aforementioned U.S. Pat. No. 7,012,600. Present electrophoretic displays may have an update time in grayscale mode of about two to three times the length of a saturation pulse (where "the length of a saturation pulse" is defined as the time period, at a specific voltage, that suffices to drive a pixel of a display from one extreme optical state to the other), or approximately 700-900 milliseconds, whereas a DUDS has a maximum update time equal to the length of the saturation pulse, or about 200-300 milliseconds.

A double rail bounce waveform or drive scheme (i.e., a drive scheme which includes at least one double rail bounce waveform) may be completely defined by assigning an impulse potential (IP) to each desired gray level, the IP ideally being the net impulse required to reach the gray level starting from one extreme optical state, typically assumed to be the white extreme optical state. A double rail bounce drive scheme allows maintenance of DC balance as the display progresses through an arbitrary series of transitions, and operates the display in a limit cycle (ignoring dwells at the desired gray levels) which should help to reduce prior history dependency. However, the intermediate step of a double rail bounce waveform (from black to white or white to black) creates a "flashy-white" and "flashy-black" transition respectively, and this can be distracting to a viewer. In addition, this additional intermediate step results in a longer update time and cannot typically (with present day commercial displays) be used for animation drive schemes with 16 gray levels.

As already mentioned, a single rail bounce drive scheme can be used in place of a double rail bounce one. A single rail bounce drive scheme eliminates the flashy intermediate black-white or white-black step of a double rail bounce waveforms, and its transitions tend to be shorter in duration than those of a double rail bounce drive scheme. However, during a series of updates to differing gray levels, the applied signal of a single rail bounce drive scheme will clearly not be periodic. Furthermore, due to the non-linear behavior of electrophoretic and similar electro-optic media, and the hysteresis between the application of a drive voltage and the optical response in such media, a significant number of tuning elements (additional waveform components, as described in several of the aforementioned MEDEOD applications) must be included in the waveforms in order to reach all the desired gray levels in a DC balanced manner. These tuning elements increase the maximum waveform length and the amount of visible flashing, thus reducing the benefits of a single rail bounce drive scheme as compared with a double rail bounce one.

The present invention seeks to achieve the advantages of a single rail bounce drive scheme (namely, reducing the distracting effect of the intermediate black-white or white-black step of a double rail bounce drive scheme, reducing update time, and permitting use of the drive scheme for applications such as animations with multiple gray levels or a dual waveform approach) while avoiding the problems of lack of robustness of the drive scheme due to it not being in a limit cycle and requiring the presence of tuning elements.

SUMMARY OF INVENTION

The fundamental idea behind the present invention is to replace the single rail bounce drive scheme used in some prior art electro-optic displays with an "alternating single rail bounce drive scheme (ASRBDS)" in which each pixel alternates in successive transitions between a single rail bounce drive scheme which bounces off the black rail and a similar scheme which bounces off the white rail.

Accordingly, this invention provides a method of driving an electro-optic display having a plurality of pixels, each of which is capable of displaying two extreme optical states and at least one intermediate gray level. Each pixel is driven from an initial intermediate gray level to one extreme optical state and thence to a first desired intermediate gray level. The pixel then remains at this first desired intermediate gray level for a finite length of time. The pixel is then driven from this first desired intermediate gray level to the opposed extreme optical state and thence to a second desired intermediate gray level.

In other words, this invention provides a method of driving an electro-optic display having a plurality of pixels, each of which is capable of displaying two extreme optical states and at least one intermediate gray level, the method comprising: (a) driving at least one pixel from an initial intermediate gray level to one extreme optical state and thence to a first desired intermediate gray level, said at least one pixel thereby forming part of a first image on the display; (b) allowing said at least one pixel to remains at the first desired intermediate gray level for a finite length of time; and (c) thereafter driving said at least one pixel from the first desired intermediate gray level to the opposed extreme optical state and thence to a second desired intermediate gray level, said at least one pixel thereby forming part of a second image on the display.

In this method of the present invention, the finite length of time will normally represent the time during which the user of the display is viewing the first image on the display, for example by reading a text image. Accordingly, this finite length of time is normally at least as great as the period during which said at least one pixel is driven from the initial intermediate gray level to one extreme optical state and thence to the first desired intermediate gray level, and thus normally is at least about one second, and in most cases considerably longer.

The present invention also provides novel display controllers arranged to carry out the methods of the present invention.

As discussed above and in the aforementioned MEDEOD applications, a particular drive scheme may be used in only certain regions of the display, which may be rectangular or of arbitrary shape. The present invention extends to a driving method and controller in which an ASRBDS is used in only one (or less than all) of a plurality of regions of a display, and a different drive scheme is applied to the remaining regions.

In the method of the present invention, the display may make use of any of the type of electro-optic media discussed above. Thus, for example, the electro-optic display may comprise a rotating bichromal member, electrochromic or electro-wetting material. Alternatively, the electro-optic display may comprise an electrophoretic material comprising a plurality of electrically charged particles disposed in a fluid and capable of moving through the fluid under the influence of an electric field. The electrically charged particles and the fluid may be confined within a plurality of capsules or microcells. Alternatively, the electrically charged particles and the fluid may be present as a plurality of discrete droplets surrounded by a continuous phase comprising a polymeric material. The fluid may be liquid or gaseous.

The displays of the present invention may be used in any application in which prior art electro-optic displays have been used. Thus, for example, the present displays may be used in electronic book readers, portable computers, tablet computers, cellular telephones, smart cards, signs, watches, shelf labels, variable transmission windows and flash drives.

BRIEF DESCRIPTION OF THE DRAWINGS

The sole FIGURE of the accompanying drawings shows a voltage against time curve for several successive transitions of one pixel of a display being driven by an ASRBDS of the present invention, and the corresponding optical states of the pixel.

DETAILED DESCRIPTION

As already mentioned, the present invention provides a (ASRBDS) method of driving an electro-optic display having a plurality of pixels, each of which is capable of displaying two extreme optical states and at least one intermediate gray level. Each pixel is driven from an initial intermediate gray level to one extreme optical state and thence to a first desired intermediate gray level. The pixel then remains at this first desired intermediate gray level for a finite length of time. The pixel is then driven from this first desired intermediate gray level to the opposed extreme optical state and thence to a second desired intermediate gray level.

A complete unique cycle for an ASRBDS may be represented symbolically as:

"R3 State"→"White Rail"→"R2 State"→"Black Rail"→"R1 State"

where R3 is an initial state of a pixel, R2 is the first desired gray level, and R1 is the second desired gray level. The manner in which the drive scheme alternates between the white and black rails enables the basic limit cycle waveform structure of a double rail bounce drive scheme to be maintained. More importantly an ASRBDS gives greater degree of freedom to achieve the gray accurate level placement and freedom from ghosting because it enables the designer to set independently two different impulse potentials i.e. one for the drive scheme which bounces off the white rail and a second for the drive scheme that bounces off the black rail.

The sole FIGURE of the accompanying drawings illustrates schematically an ASRBDS of the present invention. As shown in that FIGURE, a pixel is originally in an initial intermediate gray level R3. A negative (white-going) drive pulse is applied until the pixel reaches the white extreme optical state (white rail). A positive (black-going) drive pulse is then applied until the pixel reaches a first desired intermediate gray level R2. The pixel remains at gray level R2 until the next update of the display which requires a change in the gray level of this pixel. A further positive (black-going) drive pulse is then applied until the pixel reaches the black extreme optical state (black rail). Finally, a negative drive pulse is applied until the pixel reach a second desired intermediate gray level R1.

It will be apparent to those skilled in the art of driving electro-optic displays that two successive transitions using an ASRBDS of the present invention cause the pixel to undergo the same changes in optical state as during a single transition using a double rail bounce drive scheme; the difference between the two situations is that the ASRBDS allows the pixel to stop at an intermediate stage (the first desired intermediate gray level, R2 in the FIGURE). Accordingly, the ASRBDS should have the same advantages as regards tuning and usage as have already been demonstrated for a double rail bounce drive scheme.

In practice, the two halves of an ASRBDS (the black-rail and white-rail bounce parts) might be stored as different drive schemes, with the drive controller arranged to switch between these drive schemes on successive transitions. In one form of ASRBDS, all pixels of the display are synchronized so that every pixel is bounced off the same rail on the same update. The individual waveforms may be apex aligned, or padded (with periods of zero voltage, for example) so that not all pixels reach the rail at the same moment. Such a "synchronized" ASRBDS may be especially useful for quick photo updates where the images are complicated enough that it is not noticeable which rail is being visited. Alternatively, a non-synchronized ASRBDS may be used in which the pixels of the display are divided into two groups, for example on a checkerboard pattern, and the updates on the two groups would be of opposite parities, i.e. for a first update the first group would bounce off the white rail and the second group off the black rail, while on the next update, the first group would bounce off the black rail and the second group off the white rail. Such a drive scheme would have the benefit of reducing the apparent flash by spatial averaging cf. the aforementioned US 2013/0194250. The ASRBDS of the present invention may also be used to implement animation.

The method of the present invention may be "tuned" to produce accurate gray levels using any of the techniques described in the aforementioned MEDEOD applications. Thus, for example, the waveform used to effect either of the transitions in the method of the present invention may include drive pulses having a polarity opposite to that of the waveform as a whole. For example, if in step (a) of the present method, a pixel is driven from a dark gray level to white and then back to a light gray level, the second half of the waveform (i.e., the part of the waveform responsible for the white-to-light gray section of the transition) will typically have an overall black-going polarity. However, to ensure accurate control of the final light gray level, it may be desirable to include at least one white-going pulse in this second half of the waveform. Furthermore, for similar reasons, as discussed in the aforementioned MEDEOD applications, it is often desirable to include at least one balanced pulse pair (a pair of drive pulses of substantially equal absolute impulse value, but of opposite polarity) and/or at least one period of zero voltage in the waveform.

An ASRBDS must of course include waveforms for white-to-white transitions and black-to-black transitions. (As in the aforementioned MEDEOD applications, the term "transition" is used herein to include so-called zero transitions, in which the initial and final gray levels of the pixel are the same. Such zero transitions may or may not involve changing the gray level of the pixel during the transition.) It might at first appear that an ASRBDS would require two white-to-white waveforms, a black-rail bounce waveform which would require a flash to black before returning to white, and a white-rail bounce waveform which would be an empty transition (i.e., no drive pulse would be applied). However, such an empty transition could cause edge ghosting artifacts to appear. Accordingly, the ASRBDS could be modified to use the black-rail bounce waveform for both transitions. Alternatively, the empty white-rail bounce waveform could be used for both transitions, so that the ASRBDS would be a "global limited" drive scheme within the meaning of that term as used in the aforementioned US 2013/0194250.

From the foregoing, it will be seen that the ASRBDS of the present invention can provide a low-flash, high speed robust DC balanced drive scheme for electro-optic displays. The ASRBDS may especially be useful for displaying photographs and other continuous tone images, thus rendering displays using the drive scheme more attractive to users.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A method of driving an electro-optic display having a plurality of pixels, each of which is capable of displaying two extreme optical states and at least four intermediate gray levels, the method comprising:
    (a) driving at least one pixel from an initial intermediate gray level to a first extreme optical state and thence to a first desired intermediate gray level without driving said pixel through the opposed extreme optical state, wherein said initial intermediate gray level and said first desired intermediate gray level are not the same gray level, said at least one pixel thereby forming part of a first image on the display;
    (b) allowing said at least one pixel to remain at the first desired intermediate gray level for at least one second;
    (c) thereafter driving said at least one pixel from the first desired intermediate gray level to the opposed extreme optical state and thence to a second desired intermediate gray level without driving said pixel through the first extreme optical state, said at least one pixel thereby forming part of a second image on the display;
    (d) allowing said at least one pixel to remain at the second desired intermediate gray level for at least one second; and
    (e) thereafter driving said at least one pixel from the second desired intermediate gray level to the first extreme optical state and thence to a third desired intermediate gray level without driving said pixel through the opposed extreme optical state, said at least one pixel thereby forming part of a third image on the display.

2. A method according to claim 1 wherein steps (a)-(c) are applied only to pixels within one or more defined regions of the display and a different drive scheme is applied to pixels outside the defined region or regions.

3. A method according to claim 1 wherein the pixels of the display are divided into at least first and second groups, with the first group of pixels being driven to the first extreme optical state during step (a) and to the opposed extreme optical state during step (c), and the second group of pixels being driven to said opposed extreme optical state during step (a) and to said first extreme optical state during step (c).

4. A method according to claim 1 wherein at least one of step (a) and step (c) is carried out using a waveform which comprises at least one balanced pulse pair and/or at least one period of zero voltage.

5. A method according to claim 1 wherein the electro-optic display comprises a rotating bichromal member, electrochromic or electro-wetting material.

6. A method according to claim 1 wherein the electro-optic display comprises an electrophoretic material comprising a plurality of electrically charged particles disposed in a fluid and capable of moving through the fluid under the influence of an electric field.

7. A method according to claim 6 wherein the electrically charged particles and the fluid are confined within a plurality of capsules or microcells.

8. A method according to claim 6 wherein the electrically charged particles and the fluid are present as a plurality of discrete droplets surrounded by a continuous phase comprising a polymeric material.

9. A method according to claim 6 wherein the fluid is gaseous.

10. A display controller capable of operating a bistable electro-optic display, the display controller being arranged to carry out the method of claim 1.

11. An electro-optic display arranged to carry out the method of claim 1.

12. An electronic book reader, portable computer, tablet computer, cellular telephone, smart card, sign, watch, shelf label, variable transmission window or flash drive comprising a display according to claim 11.

13. An alternating single rail bounce drive scheme for use in driving an electrophoretic display having a plurality of pixels, each pixel having first and second extreme optical states that are opposed, said drive scheme comprising:

(a) driving a pixel between an initial intermediate gray level and a first desired intermediate gray level via the first extreme optical state, but not the second extreme optical state, wherein the initial intermediate gray level and the first desired intermediate gray level are not the same gray level;

(b) allowing the pixel to stay at the first desired intermediate gray level for at least one second (c) driving the pixel between the first desired intermediate gray level and a second desired intermediate gray level via the second extreme optical state, but not the first extreme optical state;

(d) allowing the pixel to stay at the second desired intermediate gray level for a at least one second; and (e) driving the pixel between the second desired intermediate gray level and a third desired intermediate gray level via the first extreme optical state, but not the second extreme optical state.

* * * * *